(12) United States Patent
Song

(10) Patent No.: US 7,443,249 B2
(45) Date of Patent: Oct. 28, 2008

(54) PHASE LOCKED LOOP FOR STABLY OPERATING IN A MATTER THAT IS INSENSITIVE TO VARIATION IN PROCESS, VOLTAGE AND TEMPERATURE AND METHOD OF OPERATING THE SAME

(75) Inventor: Keun Soo Song, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 82 days.

(21) Appl. No.: 11/486,136

(22) Filed: Jul. 14, 2006

(65) Prior Publication Data
US 2007/0188242 A1    Aug. 16, 2007

(30) Foreign Application Priority Data
Feb. 15, 2006    (KR) ...................... 10-2006-0014531

(51) Int. Cl.
*H03L 7/08*    (2006.01)
(52) U.S. Cl. ............................ 331/17; 331/16; 327/157
(58) Field of Classification Search .................. 331/17, 331/16; 327/157
See application file for complete search history.

(56) References Cited

U.S. PATENT DOCUMENTS

| | | | |
|---|---|---|---|
| 6,043,695 A * | 3/2000 | O'Sullivan | ................... 327/157 |
| 6,717,475 B2 * | 4/2004 | McCarthy | .................... 331/17 |
| 6,724,265 B2 * | 4/2004 | Humphreys | ................... 331/17 |
| 6,998,922 B2 * | 2/2006 | Jensen et al. | ................... 331/17 |

FOREIGN PATENT DOCUMENTS

| | | |
|---|---|---|
| JP | 09-130241 | 5/1997 |
| JP | 10-200406 | 7/1998 |

* cited by examiner

*Primary Examiner*—Robert J. Pascal
*Assistant Examiner*—Levi Gannon
(74) *Attorney, Agent, or Firm*—Lowe Hauptman Ham & Berner LLP

(57) ABSTRACT

A phase locked loop for stably operating in a matter that is insensitive to variation in PVT and a method of operating the same. The PLL according to the present invention includes a PFD, a charge pump circuit, a loop filter, a VCO, and a peak voltage detector. The PFD compares a phase or frequency of a reference signal with a phase or frequency of an output signal and outputs an up signal or a down signal based on the comparison result. The charge pump circuit generates a pumping current in response to the up signal or the down signal and increases or decreases the pumping current in response to a detection signal. The loop filter outputs control voltage according to the pumping current. The VCO outputs the output signal having a frequency determined based on the control voltage. The peak voltage detector detects the peak value of the control voltage and outputs the detection signal based on the detection result. The PLL detects the peak value of control voltage and controls the operation of a charge pump circuit based on the detection result thereby decreasing the peaking and ringing phenomena of the control voltage and then stably operating in a manner that is insensitive to variation in PVT.

26 Claims, 6 Drawing Sheets

PHASE LOCKED LOOP FOR STABLY OPERATING IN A MATTER THAT IS INSENSITIVE TO VARIATION IN PROCESS, VOLTAGE AND TEMPERATURE AND METHOD OF OPERATING THE SAME

BACKGROUND OF THE INVENTION

1. Field of the Invention

The present invention relates generally to a semiconductor device, and in particular, to a Phase Locked Loop (PLL) and a method of operating the same.

2. Description of the Related Art

In general, a PLL can be used in various semiconductor technology fields, such as semiconductor memory devices, wired/wireless communication systems, phase adjusters, frequency mixers and clock distribution systems. FIG. 1 is a block diagram schematically illustrating a conventional PLL. Referring to FIG. 1, a PLL 10 includes a Phase Frequency Detector (PFD) 11, a charge pump 12, a loop filter 13 and a Voltage Controlled Oscillator (VCO) 14. The operating process of the PLL 10 is described below. First, the PFD 11 compares the phase and frequency of a reference signal FREF with the phase and frequency of an output signal FVCO and outputs an up signal UP or a down signal DN based on the comparison result. The charge pump 12 controls the charge or discharge operation of the loop filter 13 in response to the up or down signal UP or DN. When the loop filter 13 is charged, control voltage Vc output from the loop filter 13 increases. The VCO 14 alters the frequency of the output signal FVCO in response to the control voltage Vc. The PLL 10 performs the above-described operation until the phase difference and frequency difference between the reference signal FREF and the output signal FVCO fall within a predetermined range. Thereafter, when the phase difference and frequency difference between the reference signal FREF and the output signal FVCO fall within the predetermined range, the PLL 10 is locked and the control voltage of the loop filter 13 is maintained at the voltage level which the PLL 10 is locked. In this case, the time that the PLL 10 takes to be locked may vary depending on the current drive capability of the charge pump 13. For example, when the current drive capability of the charge pump 13 increases, the time that the PLL 10 takes to be locked can decreases, but the stability of the PLL 10 decreases. In contrast, when the current drive capability of the charge pump 13 decreases, the PLL 10 can stably operate, but the time that the PLL 10 takes to be locked increases. As a result, it is preferred that the current drive capability of the charge pump 13 be set in consideration of both the time that the PLL 10 takes to be locked and the stability of the PLL 10. Meanwhile, the current drive capability of the charge pump 13 may vary depending on process, voltage and temperature (hereinafter referred to as PVT). As described above, when the current drive capability of the charge pump 13 varies based on PVT, peaking and ringing phenomena occur in the control voltage Vc in the initial locking operation of the PLL 10. Variation in the control voltage Vc based on variation in PVC is described in detail with reference to FIG. 2 below. FIG. 2 is a graph illustrating the waveform of control voltage illustrated in FIG. 1. When a semiconductor device including the PLL 10 enters a standby mode, the PLL 10 is disabled, and then the operation thereof is stopped. Thereafter, the semiconductor device switches to an active mode, the PLL 10 restarts to operate. In this case, the phase difference and frequency difference between the reference signal FREF and the output signal FVCO considerably fall outside the predetermined range. Therefore, the PFD 11 generates the up or down signal UP or DN, and then controls the charge pump 13 such that the loop filter 13 rapidly performs a charge operation. As a result, the control voltage exponentially increases. When the control voltage Vc considerably increases based on the PVT, a peaking phenomenon may occur as indicated in reference character 'A'. Such a peaking phenomenon acts as a source causing the ringing phenomenon. As a result, in the initial locking operation of the PLL 10, as the increase width of the control voltage Vc increases, the time T that the control voltage Vc takes to have a stable voltage level increases. As described above, the charge pump 12 of the PLL 10 considerably increases the control voltage Vc depending on variation in PVT in the initial locking operation, so that the peaking and ringing phenomena occur, thereby increasing the time that the PLL 10 takes to be locked.

SUMMARY OF THE INVENTION

It is, therefore, an object of the present invention to provide a PLL which detects the control voltage and controls the operation of a charge pump circuit based on the detection result, thereby decreasing the peaking and ringing phenomena of the control voltage and then stably operating in a manner that is insensitive to variation in PVT.

Another object of the present invention is to a method of operating a PLL which detects the control voltage and controls the operation of a charge pump circuit based on the detection result, thereby decreasing the peaking and ringing phenomena of the control voltage and then stably operating in a manner that is insensitive to variation in PVT.

To achieve the above and other objects, the present invention provides a PLL including a PFD, a charge pump circuit, a loop filter, a VCO, and a voltage detector. The PFD compares a phase or frequency of a reference signal with a phase or frequency of an output signal and outputs an up signal or a down signal based on the comparison result. The charge pump circuit generates a pumping current in response to the up signal or the down signal and increases or decreases the pumping current in response to a detection signal. The loop filter outputs control voltage according to the pumping current. The VCO outputs the output signal having a frequency determined based on the control voltage. The voltage detector detects the control voltage and outputs the detection signal based on the detection result.

Additionally, the present invention provides a PLL including a PFD, a charge pump circuit, a loop filter, a VCO, a divider and a voltage detector. The Phase Frequency Detector (PFD) compares a phase or frequency of a reference signal with a phase or frequency of a divided signal and outputs an up signal or a down signal based on the comparison result. The charge pump circuit generates a pumping current in response to the up signal or the down signal and increases or decreases the pumping current in response to a detection signal. The loop filter outputs control voltage according to the pumping current. The VCO outputs the output signal having a frequency determined based on the control voltage. The divider divides the output signal in a predetermined division ratio and outputs the divided signal. The voltage detector detects the control voltage and outputs the detection signal based on the detection result.

Additionally, the present invention provides a method of operating a PLL for generating an output signal in synchronous with a reference signal, including comparing a phase or frequency of a reference signal with a phase or frequency of an output signal and outputting an up signal or a down signal based on a comparison result; generating a pumping current in response to the up signal or the down signal and increasing or decreasing the pumping current in response to a detection signal; outputting control voltage according to the pumping current; adjusting the frequency of the output signal according to the control voltage; detecting the control voltage and outputting the detection signal based on a detection result; and adjusting an amount of the pumping current in response to the detection signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
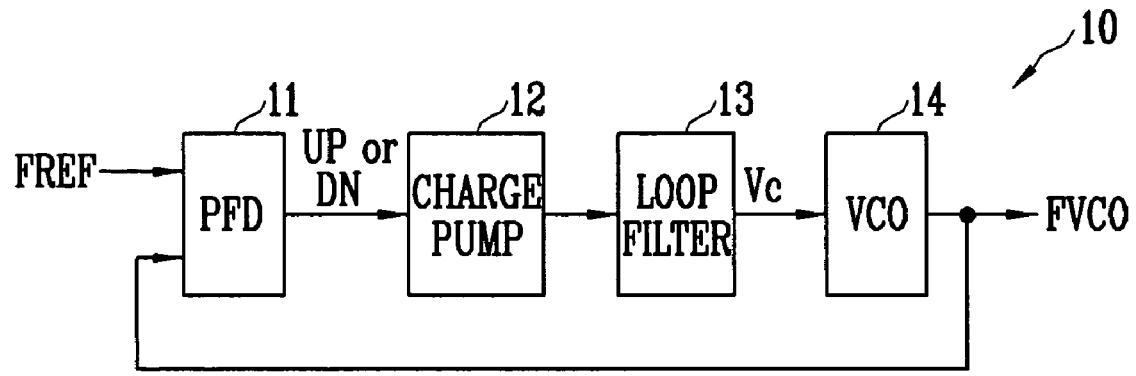
FIG. 1 is a block diagram schematically illustrating a conventional PLL.
Figure 2:
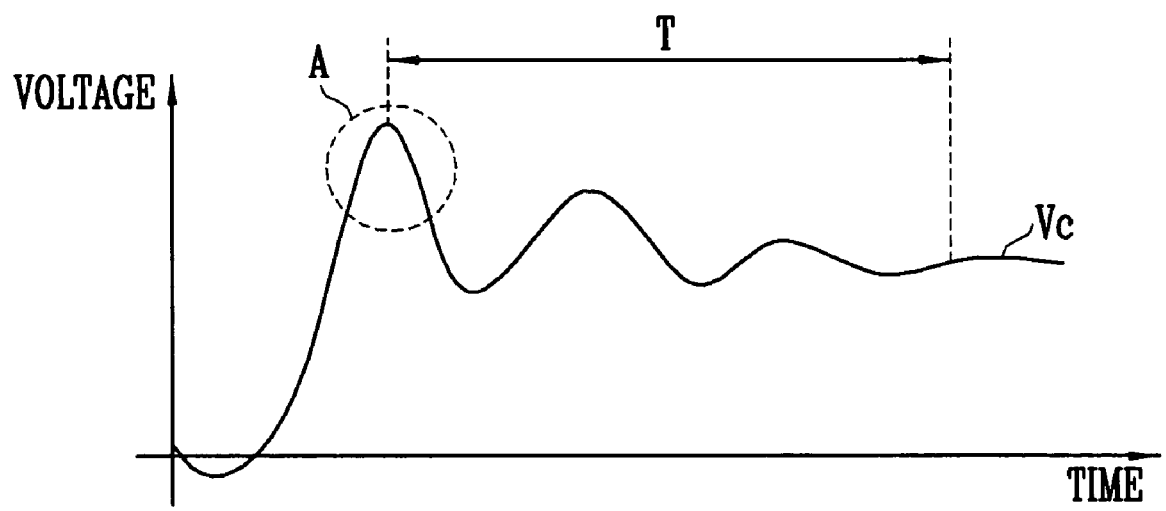
FIG. 2 is a diagram illustrating the waveform of control voltage illustrated in FIG. 1.

Several embodiments of the present invention will now be described in detail with reference to the annexed drawings. In the drawings, the same or similar elements are denoted by the same reference numerals even though they are depicted in different drawings. In the following description, a detailed description of known functions and configurations incorporated herein has been omitted for conciseness.

Figure 3:
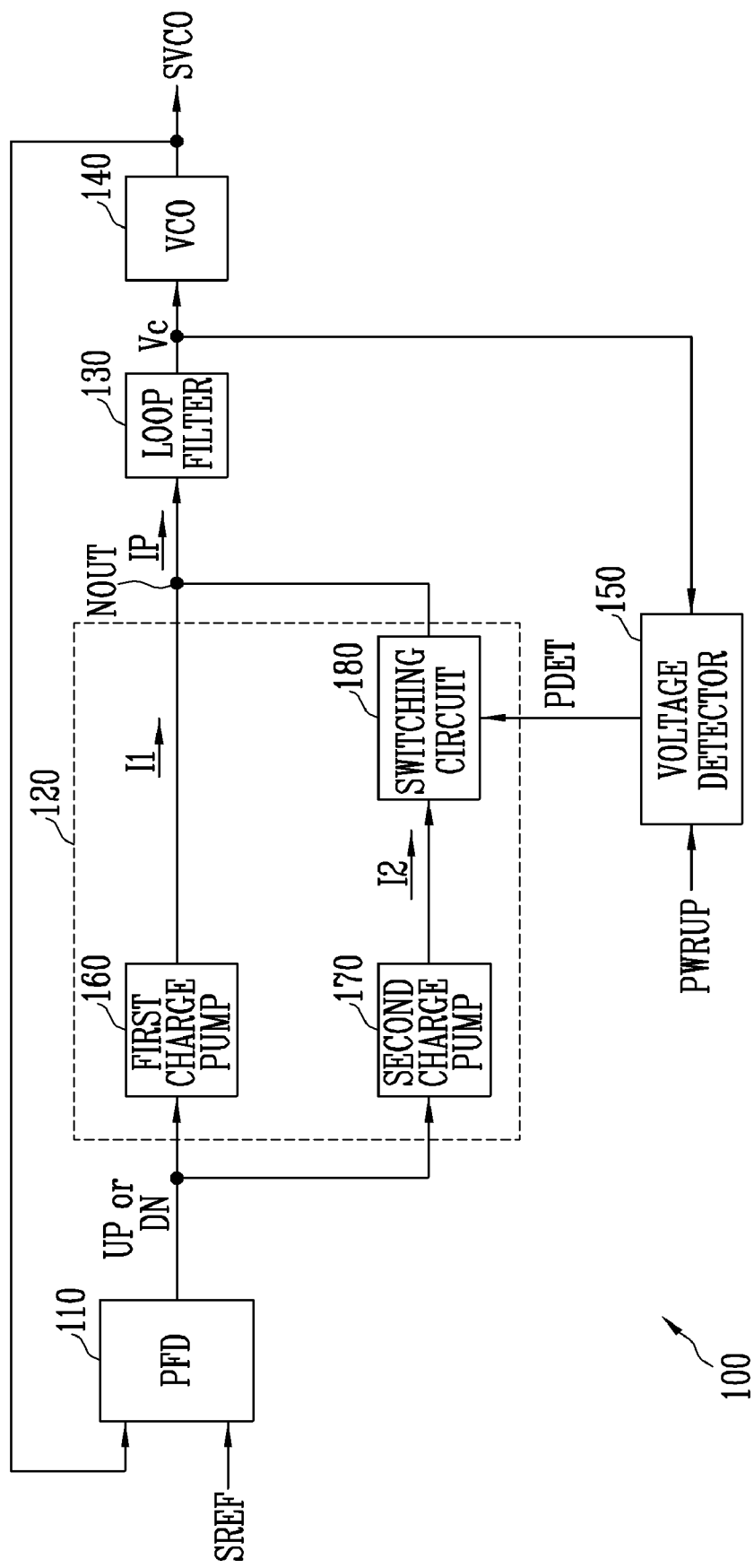
FIG. 3 is a block diagram schematically illustrating a PLL according to an embodiment of the present invention.

FIG. 3 is a block diagram schematically illustrating a PLL according to an embodiment of the present invention. Referring to FIG. 3, the PLL 100 includes a PFD 110, a charge pump circuit 120, a loop filter 130, a VCO 140 and a voltage detector 150. The PFD 110 compares the phase or frequency of a reference signal SREF with the phase or frequency of an output signal SVCO and outputs an up signal UP or a down signal DN based on the comparison result. For example, the phase difference or frequency difference between the reference signal SREF and the output signal SVCO is generated, the PFD 10 outputs the up signal UP or the down signal DN. The charge pump circuit 120 generates pumping current IP in response to the up signal UP or the down signal DN. Furthermore, the charge pump circuit 120 increases or decreases the pumping current IP in response to a detection signal PDET. In detail, the charge pump circuit 120 includes a first charge pump 160, a second charge pump 170 and a switching circuit 180. The first charge pump 160 generates a first current I1 in response to the up signal UP or the down signal DN. Also, the second charge pump 160 generates a second current I2 in response to the up signal UP or the down signal DN. The switching circuit 180 is connected in parallel to the first charge pump 160 at an output node NOUT, and connects or disconnects the output terminal the second charge pump 170 to/from the output node NOUT in response to the output signal PEDT. When the switching circuit 180 connects the output terminal of the second charge pump 170 to the output node NOUT, the amount of the pumping current IP is determined based on the sum of the first and second currents I1 and I2. Furthermore, when the switching circuit 180 disconnects the output terminal of the second charge pump 170 from the output node NOUT, the amount of the pumping current IP is determined based on the first current I1. The loop filter 130 outputs control voltage Vc according to the pumping current IP. The VCO 14 outputs the output signal SVCO having a frequency determined based on the control voltage Vc. The voltage detector 150 detects the control voltage Vc and outputs the detection signal PDET according to the detection result.

Figure 4:
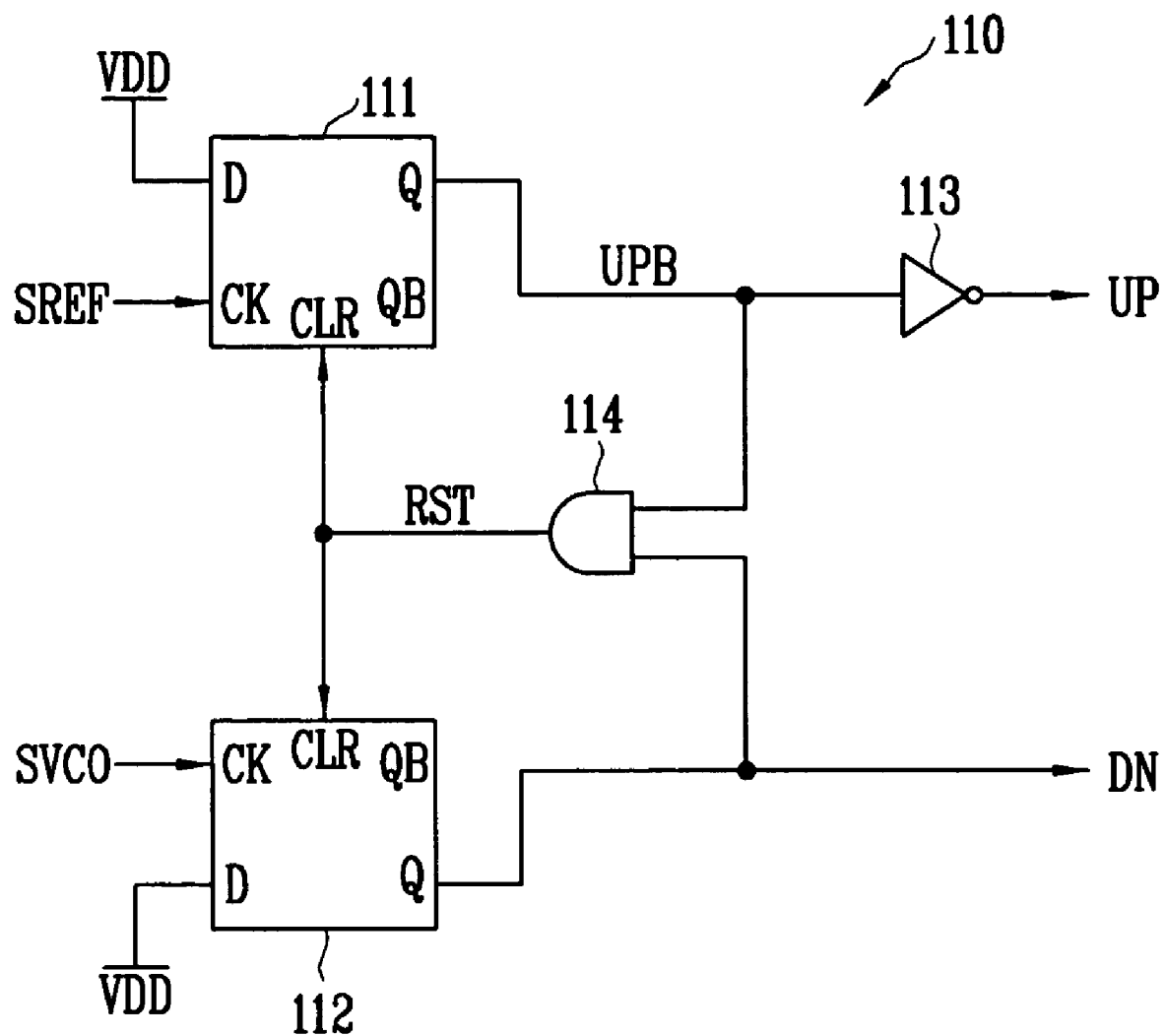
FIG. 4 is a diagram illustrating a Phase Frequency Detector (PFD) of FIG. 3 in detail according to an embodiment of the present invention.
Figure 7:
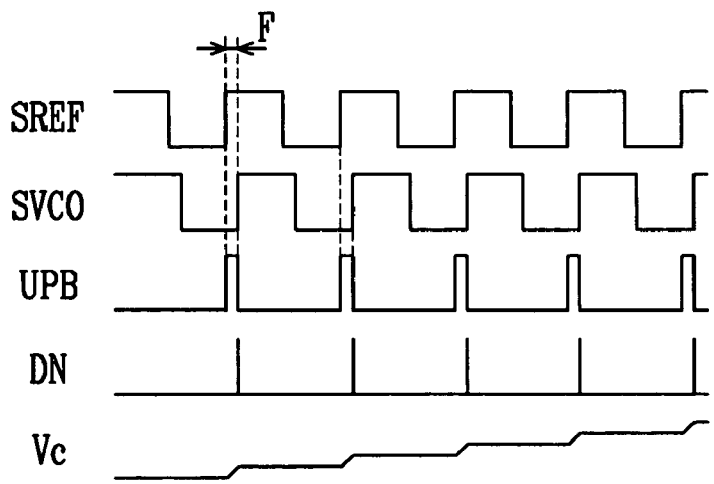
FIG. 7 is a timing diagram illustrating signals related to the operation of the PLL of FIG. 3 according to an embodiment of the present invention.

FIG. 4 is a diagram illustrating the Phase Frequency Detector (PFD) illustrated in FIG. 3 in detail. Referring to FIG. 4, PFD 110 includes D flip-flops 111 and 112, an inverter 113, and an AND gate 114. Internal voltage VDD is inputted to the D terminal of the D flip-flop 111, and the reference signal SREF is inputted to the clock input terminal CK thereof. The D flip-flop 111 outputs an output signal UPB in response to the reference signal SREF. The D terminal of the D flip-flop 112 receives the internal voltage VDD, and the clock input terminal CK thereof receives the output signal SVCO. The D flip-flop 112 outputs a down signal DN in response to the output signal SVCO. The D flip-flops 111 and 112 are respectively reset in response to a reset signal RST. The inverter 113 inverts the output signal UPB received from the D flip-flop 111 and outputs the inverted signal as an up signal UP. The AND gate 114 outputs reset signal RST in response to the output signal UPB and the down signal DN. Preferably, when the output signal UPB and the down signal DN are both enabled, the AND gate 114 enables the reset signal RST. The operation of the PFD 110 is described in detail with reference to FIG. 7. First, when the frequency of the reference signal SREF is higher than the frequency of the output signal SVCO and the frequency difference between the reference signal SREF and the output signal SVCO falls outside a predetermined range, the D flip-flop periodically enables the output signal UPB until the frequency difference falls with the predetermined range. As a result, the frequency of the output signal SVCO is close to the frequency of the reference signal SREF. In order words, the frequency difference between the reference signal SREF and the output signal SVCO falls within the predetermined range. Thereafter, the PFD 10 detects the phase difference between the reference signal SREF and the output signal SVCO and generates the up signal UP or the down signal DN based on the detection result. In detail, for example, if the phase of the reference signal SREF leads the phase of the output signal SVCO, and the phase difference of the reference signal SREF and the output signal SVCO is 'F', the D flip-flop 111 outputs the output signal UPB in the form of a pulse signal which is enabled during time F. Although not shown in FIG. 7, if the phase of the output signal SVCO leads the phase of the reference signal SREF, and the phase difference of the reference signal SREF and the output signal SVCO is 'F', the D flip-flop 112 outputs the down signal DN in the form of a pulse signal which is enabled during time F.

Figure 5:
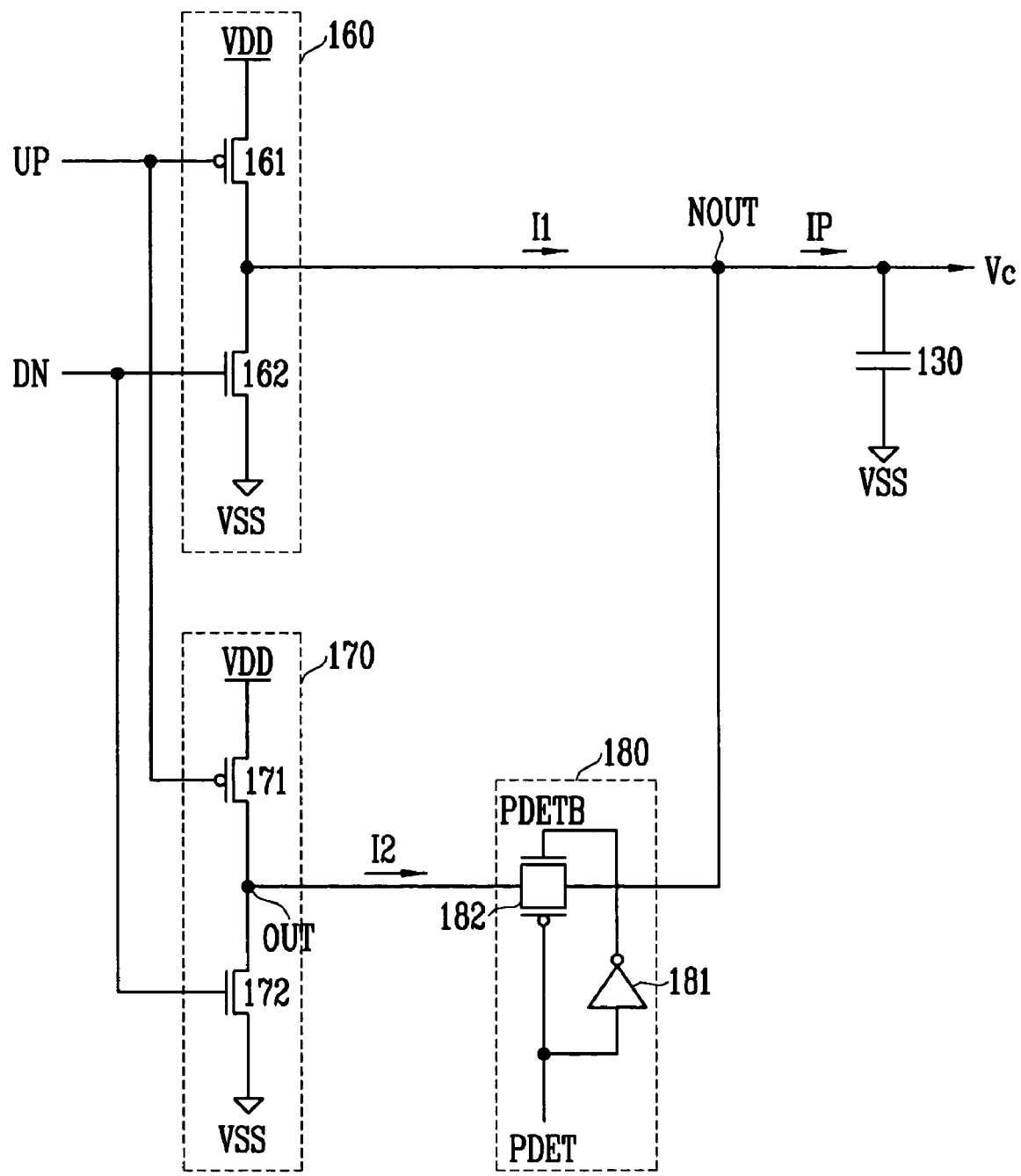
FIG. 5 is a circuit diagram illustrating first and second charge pumps, a switching circuit and a loop filter of FIG. 3 in detail according to an embodiment of the present invention.

FIG. 5 is a detailed circuit diagram illustrating the first and second charge pumps, switching circuit and loop filter of FIG.

3. Referring to FIG. 5, the first charge pump 160 includes switches 161 and 162. The switch 161 is connected between the internal voltage VDD and the output node NOUT, and is turned on or off in response to the up signal UP. Preferably, the switch 161 may be implemented using a PMOS transistor. In this case, when the up signal is disabled, the switch 161 is turned on and then generates the first current I1 to supply the first current I1 to the output node NOUT. The switch 162 is connected between the output node NOUT and a ground voltage VSS and is turned on or off in response to the down signal DN. Preferably, the switch 162 may be implemented using a NMOS transistor. In this case, when the down signal DN is enabled, the switch 12 is turned on and then discharges the output node NOUT to the ground voltage VSS. The second charge pump 170 includes switches 171 and 172. The switch 171 is connected between the internal voltage VDD and an internal output node OUT and is turned on or off in response to the up signal UP. Like the switch 161, the switch 171 may be also implemented using a PMOS transistor. In this case, the switch 171 is turned on and then generates the second current I2 when the up signal UP is disabled. The switch 172 is connected between the internal output node OUT and the ground voltage VSS, and is turned on or off in response to the down signal DN. Like the switch 162, the switch 172 may be also implemented using a NMOS transistor. In this case, the switch 172 is turned on when the down signal DN is enabled. The switching circuit 180 includes an inverter 181 and a switch 182. The inverter 181 inverts the detection signal PDET and outputs the inverted detection signal PDETB. The switch 182 is connected between the internal output node OUT and the output node NOUT and is turned on or off in response to the detection signal PDET and the inverted detection signal PDETB. Preferably, the switch 182 may be implemented using a transmission gate. The switch 182 is turned on and connects the internal output node OUT to the output node NOUT when the detection signal PDET is disabled. As a result, when the switch 182 is turned on, the pumping current IP which is output from the output node NOUT is determined based on the sum of the first and second currents I1 and I2, thus causing the pumping current IP to increase. Furthermore, when the detection signal PDET is enabled, the switch is turned off, thereby disconnecting the internal output node OUT from the output node NOUT. Therefore, when the switch 182 is turned off, the pumping current IP which is output from the output node NOUT is determined based on the first current I1, thus causing the pumping current IP to decrease. The loop filter 130 may be implemented using capacitors 131, 133 and a resistor 132 which are connected between the output node NOUT and ground voltage VSS. In this case, the loop filter 130 is charged or discharged depending on the pumping current IP and generates the control voltage Vc at the output node NOUT. When the pumping current increases, the loop filter 130 increases the control voltage Vc. Furthermore, when the pumping current IP decreases, the loop filter 130 decreases the control voltage Vc. Although, in FIG. 5, the case where the loop filter 130 is implemented using the capacitors 131 and 133, and the resistor 132 is illustrated as an example, the loop filter 130 can further includes resistors and/or capacitors and, if necessary, the construction thereof may vary.

Figure 6:
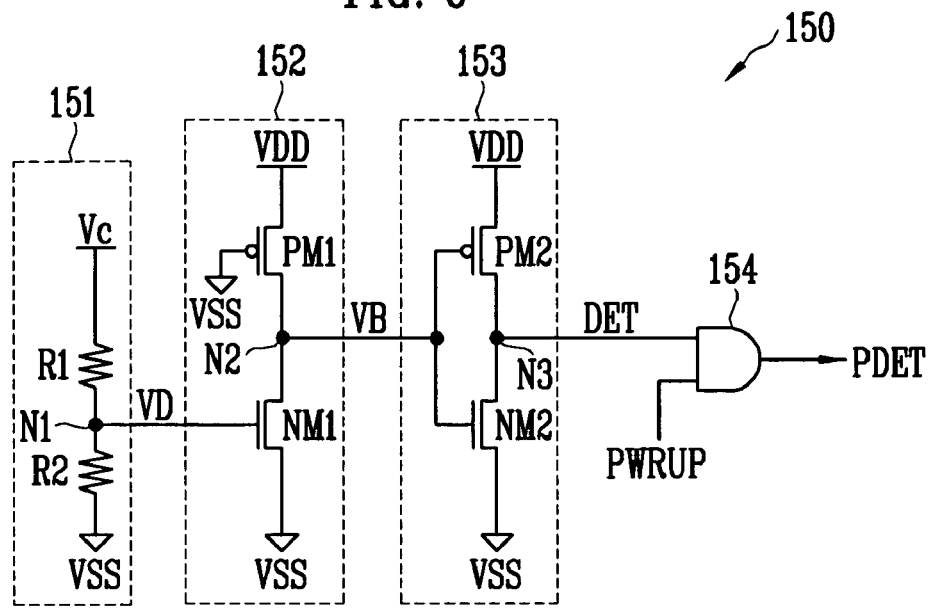
FIG. 6 is a detailed circuit diagram illustrating the voltage detector of FIG. 3 according to an embodiment of the present invention.

FIG. 6 is a detailed circuit diagram illustrating the voltage detector of FIG. 3. Referring to FIG. 6, the voltage detector 150 includes a voltage dividing circuit 151, a bias voltage generator 152, an internal output circuit 153 and an output logic circuit 154. The voltage dividing circuit 151 includes resistors R1 and R2. The voltage dividing circuit 151 divides the control voltage Vc based on the ratio of the resistors R1 and R2, and outputs the divided voltage VD to a node N1. The bias voltage generator 152 generates a bias voltage VB in response to the divided voltage VD. The bias voltage generator 152 includes a PMOS transistor PM1 and a NMOS transistor NM1. The source of the PMOS transistor PM1 is connected to the internal voltage VDD, the drain is connected to a node N2 and the gate is connected to ground voltage VSS. The PMOS transistor PM1, which acts as a pull-up transistor, supplies the internal voltage VDD to the node N2. The NMOS transistor NM1 is connected between the node N2 and the ground voltage VSS and is turned on or off in response to the divided voltage VD. The NMOS transistor NM1 acts as a pull-down transistor. Preferably, when the divided voltage VD becomes higher than the threshold voltage of the NMOS transistor NM1, the NMOS transistor NM1 is turned on. When the NMOS transistor NM1 is turned on, the bias voltage VB decreases to the level of the ground voltage VSS. Meanwhile, the reason why the voltage dividing circuit 151 includes the two resistors R1 and R2 is for preventing that the NMOS transistor NM1 is turned on by the divided voltage VD after the locking operation of the PLL 100 has been completed and then the control voltage Vc has been stabilized. When, in the initial locking operation of the PLL 100, the control voltage Vc dramatically increases, thereby occurring the peaking phenomenon, the peak value of the control voltage Vc is much higher than the peak value after the control voltage Vc has been stabilized. As a result, it is preferable that, the ratio of the resistors R1 and R2 be set such that the divided voltage VD be much higher than the threshold voltage of the NMOS transistor NM1 when the peaking phenomenon occurs, and the divided voltage VD be lower than the threshold voltage of the NMOS transistor NM1 after the control voltage Vc has been stabilized.

The internal output circuit 153 outputs an internal detection signal DET in response to the bias voltage VB. Preferably, when the bias voltage VB is at the level of the ground voltage VSS, the internal output circuit 153 enables the internal detection signal DET. Furthermore, when the bias voltage VB is at the level of the internal voltage VDD, the internal output circuit 153 disables the internal detection signal DET. The internal output circuit 153 includes a PMOS transistor PM2 and a NMOS transistor NM2. The PMOS transistor PM2 is connected between the internal voltage VDD and a node N3. The PMOS transistor PM2, which acts as a pull-up transistor, is turned on or off in response to the bias voltage VB. The NMOS transistor NM2 is connected between the node N3 and the ground voltage VSS. The NMOS transistor NM2, which acts as a pull-down transistor, is turned on or off in response to the bias voltage VB. When the PMOS transistor PM2 is turned on, the NMOS transistor NM2 is turned off. The output logic circuit 154 outputs the detection signal PDET in response to a power-up signal PWRUP and the internal detection signal DET. The power-up signal PWRUP is enabled when the internal voltge VDD reaches to a predetermined value in the initial operation of a semiconductor device including the PLL 100, and then is maintained in the enable state.

Figure 8:
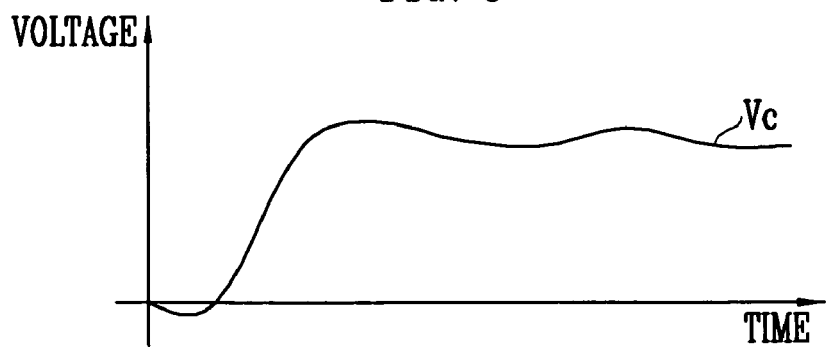
FIG. 8 is a diagram illustrating the waveform of the control voltage of FIG. 3 according to an embodiment of the present invention.

The operation of the PLL 100 is described below in detail. In this embodiment, the following description is given under the assumption that the phase of the reference signal SREF leads the phase of the output signal SVCO and the phase difference between the reference signal SREF and the output signal SVCO is 'F' is described. First, the PFD 110 compares the phase or frequency of the reference signal SREF with the phase or frequency of the output signal SVCO, and outputs the up signal UP or the down signal DN based on the comparison result. Since the phase of the reference signal SREF leads the phase of the output signal SVCO, the PFD 110 outputs the up signal UP in the form of a low pulse signal. Meanwhile, in initial, the voltage detector 150 disables the detection signal PDET. As a result, the switching circuit 180 connects the output terminal of the second charge pump 170 to the output node NOUT. The first and second charge pumps 160 and 170 respectively generate the first and second currents I1 and I2 in response to the up signal UP. Therefore, the pumping current corresponding to the sum of the first and second currents I1 and I2 from the output node NOUT is output to the loop filter 130. The loop filter 130 is charged according to the pumping current IP, and then increases the control voltage Vc dramatically as illustrated in FIG. 8. In response to the control voltage Vc, the VCO 140 adjusts the frequency of the output signal SVCO. The voltage detector 150 enables the detection signal DET when the control voltage Vc is higher than a predetermined value. The switching circuit 180 disconnects the output terminal of the second charge pump 170 from the output node NOUT in response to the detection signal DET. As a result, the pumping current IP corresponding to the first current I1 from the output node NOUT is output to the loop filter 130. Therefore, the pumping current IP is caused to decrease. The loop filter 130 adjusts the control voltage Vc and depending on the pumping current IP. In order words, the loop filter 130 gradually increases the control voltage Vc. As described above, the PLL 100 performs control such that the voltage detector 150 detects the control voltage Vc, and, based on the detection result, the switching circuit 180 connects or disconnects the second charge pump 170 to/from the output node NOUT, so that the peaking phenomenon seldom occurs in the control voltage Vc. As a result, although the current drive capability of the first and second charge pumps 160 and 170 increases according to variation in PVT, the PLL 100, at the initial locking operation, can detect the considerable increases of the control voltage Vc and decreases the occurrence of the peaking phenomenon in the control voltage Vc. As illustrated in FIG. 8, in the initial locking operation of the PLL 100, the increases in width of the control voltage Vc decreases, so that the time that the control voltage Vc takes to be stabilized decreases, thereby decreasing the time that the PLL 100 takes to be locked. Furthermore, the occurrence of the peaking and ringing phenomena of the control voltage Vc decrease, so that the stability of the PLL 100 can be improved.

Figure 9:
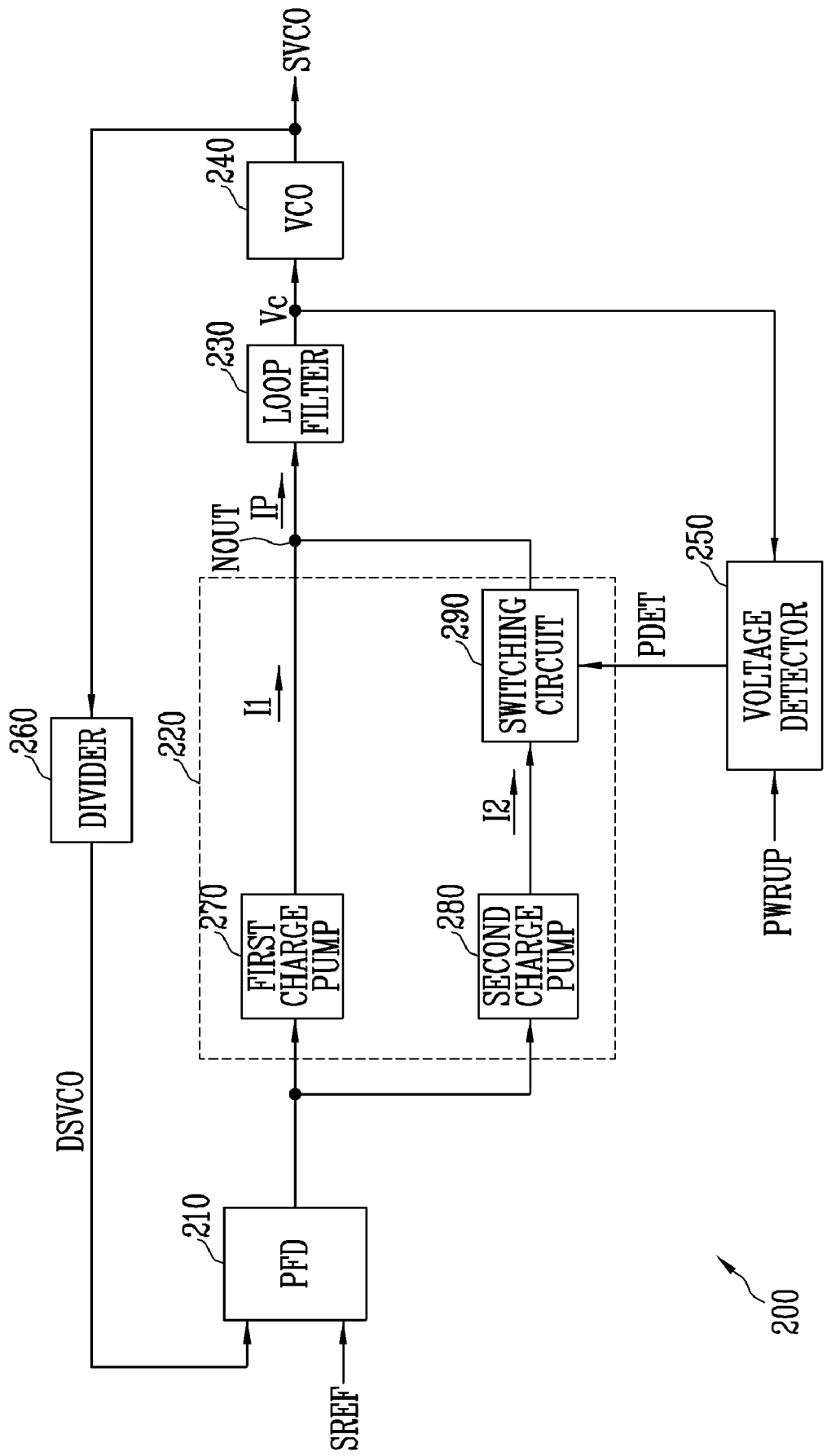
FIG. 9 is a block diagram schematically illustrating a PLL according to another embodiment of the present invention.

FIG. 9 is a block diagram schematically illustrating a PLL according to another embodiment of the present invention. Referring to FIG. 9, a PLL 200 includes a PFD 210, a charge pump circuit 220, a loop filter 230, a VCO 240, a voltage detector 250 and a divider 260. The construction and detail operation of the PLL 200 are substantially similar to those of PLL 100 except for some differences which are described. The PLL 200 is different from the PLL 100 in that the PLL 200 further includes the divider 260, and the PFD 210 compares the phase or frequency of the reference signal SREF with the phase or frequency of a divided signal DSVCO. The divider 260 divides the output signal SVCO in a predetermined division ratio and outputs the divided signal DSVCO. The PFD 210 compares the phase or frequency of the reference signal SREF with the phase or frequency of the divided signal DSVCO and outputs a up signal UP or a down signal DN. Preferably, the frequencies of the divided signal DSVCO and the reference signal SERF are lower than that of the output signal SVCO. As a result, when the frequency of the output signal SVCO is required to further increase, the divider 260 can be used for the PLL 200.

As described above, the PLL according to the present invention detects the control voltage and controls the operation of a charge pump circuit based on the detection result thereby decreasing the peaking and ringing phenomena of the control voltage and then stably operating in a matter that is insensitive to variation in PVT.

While the invention has been shown and described with reference to certain embodiments thereof, it will be understood by those skilled in the art that various changes in form and details may be made therein without departing from the spirit and scope of the invention as defined and claimed by the appended claims.

What is claimed is:

1. A Phase Locked Loop (PLL), comprising:
  a Phase Frequency Detector (PFD) for comparing a phase or frequency of a reference signal with a phase or frequency of an output signal and outputting an up signal or a down signal based on a comparison result;
  a charge pump circuit for generating a pumping current in response to the up signal or the down signal and increasing or decreasing the pumping current in response to a detection signal, wherein the charge pump circuit comprises:
    a first charge pump for generating a first current in response to the up signal or the down signal;
    a second charge pump for generating a second current in response to the up signal or the down signal; and
    a switching circuit connected in parallel to the first charge pump at an output node for connecting or disconnecting an output terminal of the second charge pump to or from the output node;
  a loop filter for outputting control voltage according to the pumping current;
  a Voltage Controlled Oscillator (VCO) for outputting the output signal having a frequency determined based on the control voltage; and
  a voltage detector for detecting the control voltage and outputting the detection signal based on a detection result.

2. The PLL set forth in claim 1, wherein the first charge pump comprises:
  a first switch connected between internal voltage and the output node for being turning on or off in response to the up signal; and
  a second switch connected between the output node and ground voltage for being turning on or off in response to the down signal,
  wherein, when any one of the first and second switches, the remaining switch is turned off, and when the first switch is turned on, the first current is supplied to the output node.

3. The PLL set forth in claim 1, wherein the second charge pump comprises:
  a first switch connected between internal voltage and an internal output node for being turning on or off in response to the up signal; and
  a second switch connected between the internal output node and ground voltage for being turning on or off in response to the down signal,
  wherein, when any one of the first and second switches, the remaining switch is turned off, and when the first switch is turned on, the second current is supplied to the switching circuit.

4. The PLL set forth in claim 3, wherein the switching circuit comprises:
  an inverter for inverting the detection signal and outputting the inverted detection signal;

a third switch connected between the internal output node and the output node for being turned on or off in response to the detection signal and the inverted detection signal.

5. The PLL set forth in claim 1, wherein, when the switching circuit connects the output terminal of the second charge pump to the output node, an amount of the pumping current is determined based on a sum of the first and second currents, and when the switching circuit disconnects the output terminal of the second charge pump from the output node, the amount of the pumping current is determined based on the first current.

6. The PLL set forth in claim 1, wherein the voltage detector enables the detection signal when the control voltage becomes higher than a predetermined value, and, when the detection signal is enabled, the switching circuit disconnects the output terminal of the second charge pump from the output node in response to the detection signal.

7. The PLL set forth in claim 1, wherein the voltage detector comprises:
  a voltage dividing circuit for dividing the control voltage and outputting a divided voltage;
  a bias voltage generator for generating a bias voltage in response to the divided voltage;
  an internal output circuit for outputting an internal detection signal in response to the bias voltage; and
  an output logic circuit for outputting the detection signal in response to a power-up signal or the internal detection signal.

8. The PLL set forth in claim 7, wherein the voltage dividing circuit increases the divided voltage when the control voltage increases, and decreases the bias voltage when the divided voltage increases.

9. The PLL set forth in claim 7, wherein the voltage dividing circuit comprises:
  a first resistor connected between the control voltage and the output node; and
  a second resistor connected between the output node and ground voltage,
  wherein the divided voltage is determined based on a ratio of the first and second resistors and the control voltage.

10. The PLL set forth in claim 7, wherein the bias voltage generator comprises:
  a pull-up transistor for supplying the internal voltage to the output node; and
  a pull-down transistor connected to the ground voltage at the output node for being turned on or off in response to the divided voltage,
  wherein, when the pull-down transistor is turned on, the bias voltage generated at the output node decreases, and, when the pull-down transistor is turned off, the bias voltage increases.

11. The PLL set forth in claim 7, wherein the internal output circuit comprises:
  a pull-up transistor connected between the internal voltage and the output node for being turned on or off in response to the bias voltage; and
  a pull-down transistor connected between the output node and the ground voltage for being turned on or off in response to the bias voltage,
  wherein, when any one of the pull-up and pull-down transistors is turned on, the remaining transistor is turned off, and when any one of the pull-up and pull-down transistors is turned on, the internal detection signal output to the output node is enabled or disabled.

12. The PLL set forth in claim 7, wherein the output logic circuit comprises an AND gate for outputting the detection signal in response to the power-up signal and the internal detection signal.

13. A Phase Locked Loop (PLL), comprising:
  a PFD for comparing a phase or frequency of a reference signal with a phase or frequency of a divided signal and outputting an up signal or a down signal based on a comparison result;
  a charge pump circuit for generating a pumping current in response to the up signal or the down signal and increasing or decreasing the pumping current in response to a detection signal, wherein the charge pump circuit comprises:
    a first charge pump for generating a first current in response to the up signal or the down signal;
    a second charge pump for generating a second current in response to the up signal or the down signal; and
    a switching circuit connected in parallel to the first charge pump at an output node for connecting or disconnecting an output terminal of the second charge pump to or from the output node;
  a loop filter for outputting control voltage according to the pumping current;
  a VCO for outputting the output signal having a frequency determined based on the control voltage;
  a divider for dividing the output signal in a predetermined division ratio and outputting the divided signal; and
  a voltage detector for detecting the control voltage and outputting the detection signal based on a detection result.

14. The PLL set forth in claim 13, wherein the first charge pump comprises:
  a first switch connected between internal voltage and the output node for being turning on or off in response to the up signal; and
  a second switch connected between the output node and ground voltage for being turning on or off in response to the down signal,
  wherein, when any one of the first and second switches, the remaining switch is turned off, and when the first switch is turned on, the first current is supplied to the output node.

15. The PLL set forth in claim 13, wherein the second charge pump comprises:
  a first switch connected between internal voltage and an internal output node for being turning on or off in response to the up signal; and
  a second switch connected between the internal output node and ground voltage for being turning on or off in response to the down signal,
  wherein, when any one of the first and second switches, the remaining switch is turned off, and when the first switch is turned on, the second current is supplied to the switching circuit.

16. The PLL set forth in claim 15, wherein the switching circuit comprises:
  an inverter for inverting the detection signal and outputting the inverted detection signal;
  a third switch connected between the internal output node and the output node for being turned on or off in response to the detection signal and the inverted detection signal.

17. The PLL set forth in claim 13, wherein the voltage detector enables the detection signal when the control voltage becomes higher than a predetermined value, and, when the detection signal is enabled, the switching circuit disconnects the output terminal of the second charge pump from the output node in response to the detection signal.

18. The PLL set forth in claim 13, wherein the voltage detector comprises:
a voltage dividing circuit for dividing the control voltage and outputting a divided voltage;
a bias voltage generator for generating a bias voltage in response to the divided voltage;
an internal output circuit for outputting an internal detection signal in response to the bias voltage; and
an output logic circuit for outputting the detection signal in response to a power-up signal or the internal detection signal.

19. The PLL set forth in claim 18, wherein the voltage dividing circuit increases the divided voltage when the control voltage increases, and decreases the bias voltage when the divided voltage increases.

20. The PLL set forth in claim 18, wherein the voltage dividing circuit comprises:
a first resistor connected between the control voltage and the output node; and
a second resistor connected between the output node and ground voltage,
wherein the divided voltage is determined based on a ratio of the first and second resistors and the control voltage.

21. The PLL set forth in claim 18, wherein the bias voltage generator comprises:
a pull-up transistor for supplying the internal voltage to the output node; and
a pull-down transistor connected to the ground voltage at the output node for being turned on or off in response to the divided voltage,
wherein, when the pull-down transistor is turned on, the bias voltage generated at the output node decreases, and, when the pull-down transistor is turned off, the bias voltage increases.

22. The PLL set forth in claim 18, wherein the internal output circuit comprises:
a pull-up transistor connected between the internal voltage and the output node for being turned on or off in response to the bias voltage; and
a pull-down transistor connected between the output node and the ground voltage for being turned on or off in response to the bias voltage,
wherein, when any one of the pull-up and pull-down transistors is turned on, the remaining transistor is turned off, and when any one of the pull-up and pull-down transistors is turned on, the internal detection signal output to the output node is enabled or disabled.

23. The PLL set forth in claim 18, wherein the output logic circuit comprises an AND gate for outputting the detection signal in response to the power-up signal and the internal detection signal.

24. The PLL set forth in claim 13, wherein, when the switching circuit connects the output terminal of the second charge pump to the output node, an amount of the pumping current is determined based on a sum of the first and second currents, and when the switching circuit disconnects the output terminal of the second charge pump from the output node, the amount of the pumping current is determined based on the first current.

25. A method of operating a PLL for generating an output signal in synchronous with a reference signal, comprising:
comparing a phase or frequency of a reference signal with a phase or frequency of an output signal and outputting an up signal or a down signal based on a comparison result;
generating a pumping current in response to the up signal or the down signal and increasing or decreasing the pumping current in response to a detection signal;
outputting control voltage according to the pumping current;
adjusting the frequency of the output signal according to the control voltage;
detecting the control voltage and outputting the detection signal based on a detection result, wherein the outputting the detection signal comprises:
dividing the control voltage and outputting a divided voltage;
generating a bias voltage in response to the divided voltage;
outputting an internal detection signal in response to the bias voltage; and
outputting the detection signal in response to a power-up signal and the internal detection signal; and
adjusting an amount of the pumping current in response to the detection signal.

26. The PLL set forth in claim 25, wherein the adjusting the amount of the pumping current comprises:
the detection signal increasing the amount of the pumping current by operating both first and second charge pumps when the control voltage is lower than a predetermined value; and
the detection signal decreasing the amount of the pumping current by operating any one of the first and second charge pumps when the control voltage is higher than a predetermined value.

* * * * *